(12) United States Patent
Schenker

(10) Patent No.: US 6,503,672 B2
(45) Date of Patent: Jan. 7, 2003

(54) ELECTRON BEAM PROJECTION UTILIZING MULTIPLE EXPOSURES WITH DIFFERENT CURRENT DENSITIES

(75) Inventor: Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,101

(22) Filed: Mar. 27, 2001

(65) Prior Publication Data

US 2002/0172890 A1 Nov. 21, 2002

(51) Int. Cl.$^7$ ............................... G03F 9/00; G03C 5/00
(52) U.S. Cl. ............................ 430/30; 430/5; 430/296; 430/942; 250/492.2
(58) Field of Search .......................... 430/30, 296, 942, 430/5; 250/492.2

(56) References Cited

U.S. PATENT DOCUMENTS 5,908,733 A * 6/1999 Onoda ........................ 430/30
6,117,600 A * 9/2000 Nakasuji ..................... 430/296

* cited by examiner

*Primary Examiner*—Christopher G. Young
(74) *Attorney, Agent, or Firm*—Fish & Richardson P.C.

(57) ABSTRACT

Lithography is carried out by dividing the pattern into less critical features and more critical features. The more critical features are patterned slower to obtain more resolution. The less critical features can be patterned at higher current, which allows a faster patterning.

16 Claims, 2 Drawing Sheets

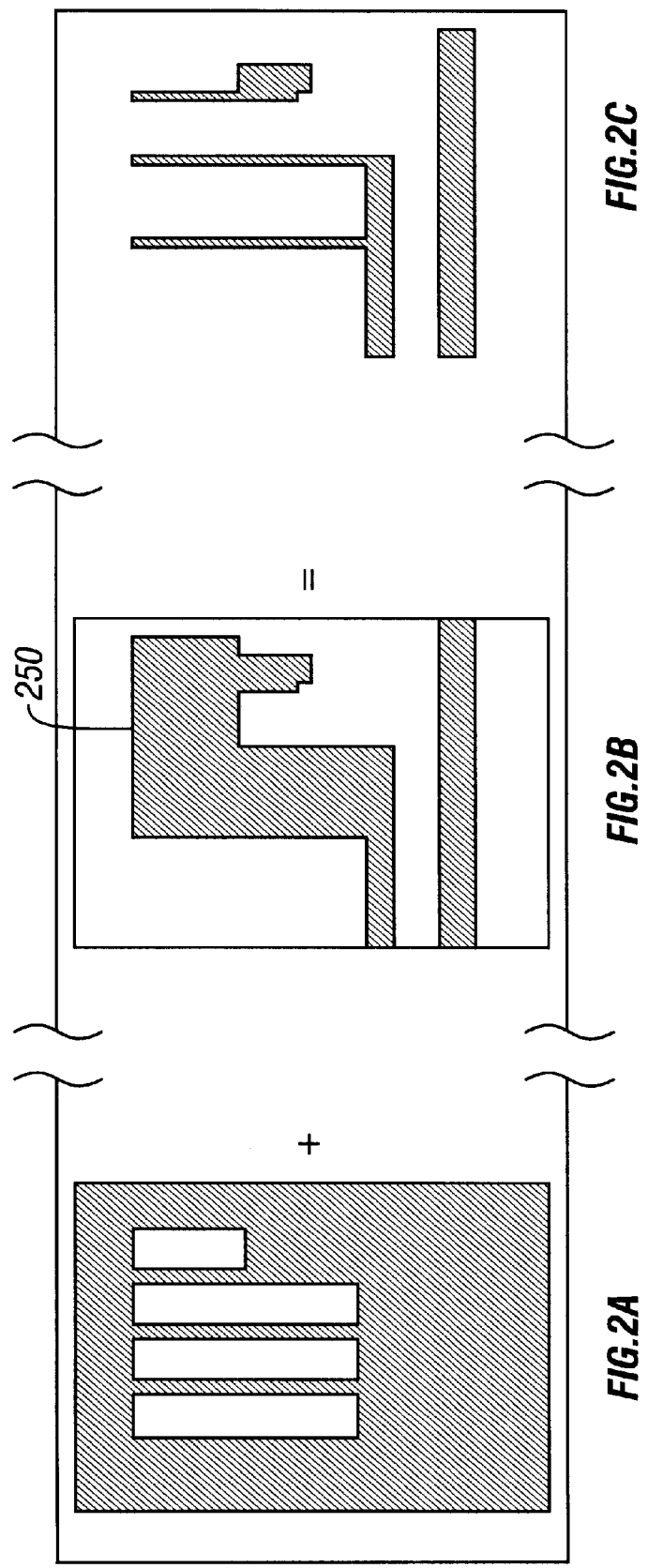

ELECTRON BEAM PROJECTION UTILIZING MULTIPLE EXPOSURES WITH DIFFERENT CURRENT DENSITIES

BACKGROUND

Electron beam projection can be used for many purposes, including formation of features on semiconductor substrates. The power, i.e., current, may be intentionally increased in order to increase the throughput of the process. However, as the current used by the tools increases, the interactions between electrons may also increase. These interactions may cause image blurring and may cause field uniformity degradation of critical dimension control. Because of these imaging aberrations, the critical dimension control may degrade as the total beam current is increased.

BRIEF DESCRIPTION OF THE DRAWINGS

These and other aspects will now be described in detail with reference to the accompanying drawings wherein:

FIGS. 2A–2C show the way in which the device layout is divided into patterns.

DETAILED DESCRIPTION

Figure 1:
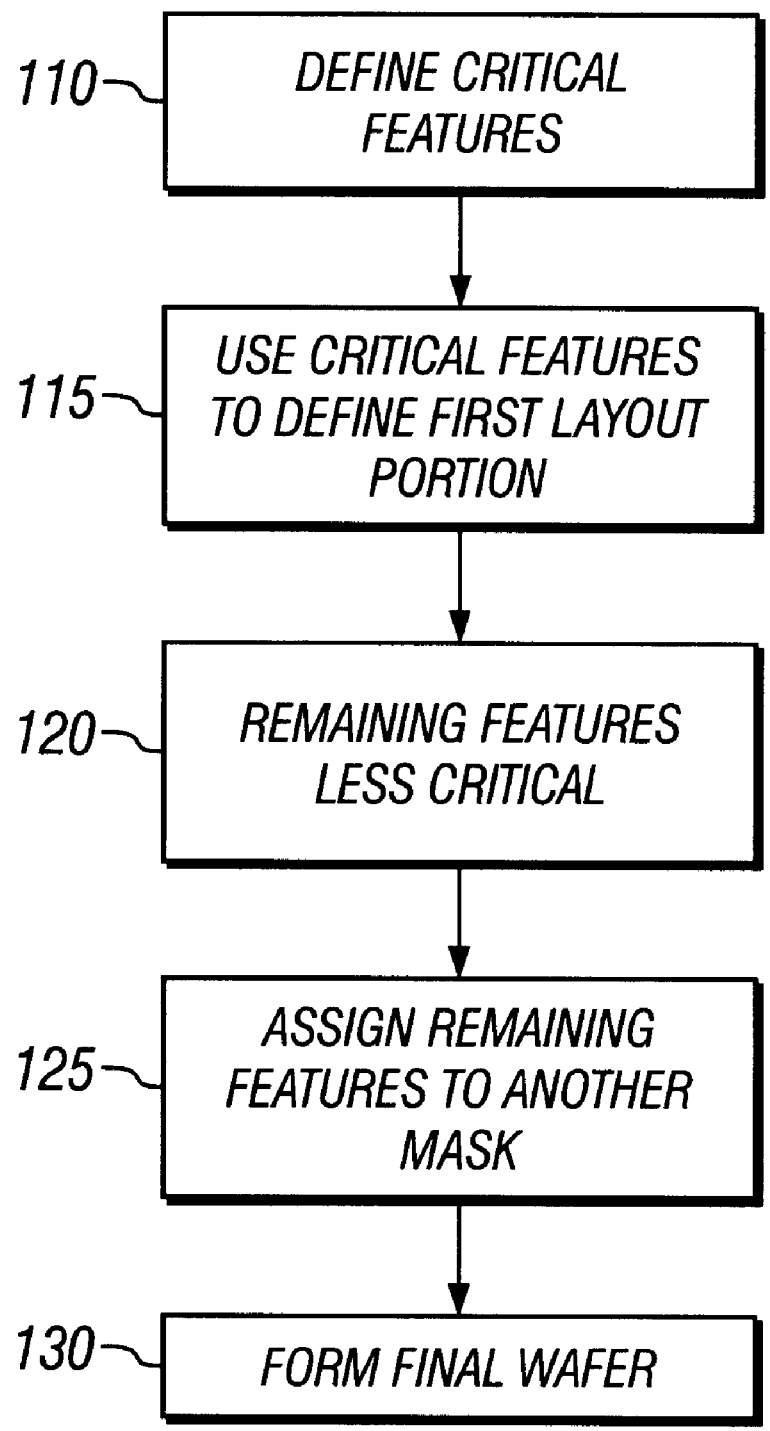
FIG. 1 shows a flowchart of the operation of an embodiment.

According to the present system, electron space charge effects are reduced by reducing beam current density. This reduction may be carried out by dividing the required exposure area into different regions, e.g., two different regions.

If two regions are used, they may be defined as being one of a more critical region or a less critical region. The regions which are more critical can be patterned with a lower current and hence better image fidelity. These more critical regions can be better dimension-controlled, without requiring reduction of the current density. Those regions which are less critical can be patterned with a higher current, which allows the patterning to occur faster, but with somewhat less fidelity.

One operation of this system may require two passes to define the device pattern. However, this may still improve image fidelity, since the total area may be less than 50 percent of the total clear area.

The present system defines the device layout in two parts. FIG. 1 shows a flowchart of the operation used in the embodiment. FIGS. 2A–2C show the way in which the device layout is divided into patterns.

FIG. 2C shows the overall device layout.

FIGS. 2A and 2B show the separated pattern parts of this layout: FIG. 2A shows the more critical features, i.e. those which have minimum clear exposure areas.

FIG. 2B includes a pattern 250 which defines non critical features and prevents unwanted final patterns. Dark regions define locations where the electrons do not transmit to the wafer. Light regions, in contrast, define locations where electrons are transmitted to reach the wafer and more specifically the photosensitive material on the wafer.

By defining the more critical features using FIG. 2A, and the less critical features using FIG. 2B, electron-to-electron interactions may be reduced because of the reduction of total current. This may result in better pattern resolution and control.

In FIG. 1 at 110, critical features of the device pattern that require improved electron imaging are defined. These improved features are those that require better resolution, i.e. those with small feature pitches. The improved features can alternatively be those which require improved imaging uniformity, such as lines that define the transistor size in an integrated circuit. These critical features can be defined by a number of techniques depending on the device or layer requirements. For example, critical features may be defined as those lines that define poly silicon gates. Another example is that the critical features could be defined by only the smallest lines in any specific layout.

Software tools which are commercially available, such as database engines with Boolean capabilities, can be used to identify those features. The features can be identified in the database. The critical features can be lines, spaces or any other kind of feature. The definition of critical features forms the first layout portion (FIG. 2A) at 115.

A minimum clear area to define the critical feature may be identified using a database manipulation engine. As described above, this minimum clear area can be the area directly adjacent to a line or critical space. This area is assigned to one mask.

The remaining features are taken at 120 to represent the less critical features. These remaining areas are assigned to another mask at 125. This remaining clear area can represent the less critical area.

Some regions may be clear on both masks in order to ensure that unwanted features are not generated on the wafer due to errors in alignment between the two masks.

The final wafer pattern may be generated by exposing each mask on the wafer using well-known optical lithography techniques also used for electron beam projection lithography.

The above has described the two mask patterns being formed on two separate masks. However, both mask patterns could be formed on physically the same plate and still improve the throughput of defining the wafer pattern.

The inventors have found that beam blur may increase as the beam current approximately as a function between about two-thirds and about 1. This means that if the current increases by a factor of 5, beam blur may increase by a factor between 2.9 and 5. The present system may improve the exposure time, but the improvement depends on the fraction of the clear area that must be patterned with the critical exposure mask. Different percentages of clear area therefore may determine how much improvement is obtained from this system. For example, the following table shows improvement in exposure time taking into account the need to expose twice.

| Percent clear area on critical mask | Blur goes as 1 ^(2/3) | Blur goes as 1 |
|---|---|---|
| 2% | 6.8X | 25X |
| 5% | 3.7X | 10X |
| 10% | 2.3X | 5X |
| 15% | 1.8X | 3.3X |
| 20% | 1.5X | 2.5X |

Although only a few embodiments have been disclosed in detail above, other modifications are possible. For example, while this system described operating with two different parts and two different masks, it is contemplated that the operation could be divided into any desired number of different parts and different masks.

All such modifications are intended to be encompassed within the following claims, in which:

What is claimed is:

1. A method, comprising determining a desired pattern to be formed using electrons;

dividing said desired pattern into a first pattern part and a second pattern part, wherein said first pattern part is a more critical region, and said second pattern part is a less critical region; and using said electrons on said first pattern part at a different time than said electrons are used on said second pattern part, and wherein said operating on said first pattern part uses a lower current density, in order to obtain better pattern image fidelity.

2. A method as in claim 1, wherein said first pattern part is operated on by using different operating characteristics which allow more accuracy in a final pattern as compared with said second pattern part.

3. A method as in claim 1, wherein using said electrons comprises using said electrons for an electron beam projection.

4. A method as in claim 1 wherein using comprises using said electrons on said first pattern part during a first pass at a first time, and using said electrons on said second pattern part during a second pass at a second time.

5. A method as in claim 1, wherein said first pattern part and said second pattern part are on physically separate plates.

6. A method as in claim 1, wherein said first pattern part and said second pattern part are on physically the same plate.

7. A method, comprising:

forming a pattern that will be exposed using electron beam projection;

preventing electron-to-electron interactions without decreasing current density of the entire pattern;

dividing said pattern into first and second pattern parts where said first pattern part includes features which are more critical than features on said second pattern part; and using electron beam projection on said first pattern part and separately using electron beam projection on said second pattern part with a power level used during said first electron beam projection on said first pattern part being lower then a power level used during said second electron beam projection on said second pattern part.

8. A method as in claim 7, further comprising identifying critical regions, and defining said critical regions as being within said first pattern part, and identifying noncritical regions, and defining said noncritical regions as being within said second pattern part.

9. A method, comprising:

forming a pattern that will be exposed using electron beam projection; and preventing electron-to-electron interactions without decreasing current density of the entire pattern;

dividing said pattern into first and second pattern parts;

identifying critical regions using a database manipulation engine to identify said parts, and defining said critical regions as being within said first pattern part, and identifying noncritical regions, and defining said noncritical regions as being within said second pattern part; and using electron bean projection on said first pattern part separately from using said electron beam projection on said second pattern part, wherein said power level used during said first electron beam projection on said first pattern part is lower then said power level used during said second electron beam projection on said second pattern part.

10. A method as in claim 8, further comprising determining smallest lines in a specified design, and defining said critical regions as including said smallest lines.

11. A method as in claim 8, further comprising determining lines which define a specified semiconductor feature, and defining said critical regions as including said specified semiconductor feature.

12. A method as in claim 11 wherein said specified semiconductor feature includes a poly silicon gate.

13. A method as in claim 7, wherein said dividing comprises identifying critical features, defining said critical features on a first mask, defining all features other than said critical features on a second mask, and using said first and second masks to form a pattern.

14. A method as in claim 13, wherein said using said first and second masks includes using said first and second masks at different power levels.

15. An electron beam projection system, comprising:

a source of electron beams, capable of operating at least at a first power and a second power;

a first mask having patterns thereon intended for operating at said first power; and a second mask having patterns portions thereon intending for operating at said second power.

16. A system as in claim 15, wherein the first mask and second mask are physically on the same plate.

* * * * *